(12) United States Patent
Kuczynski et al.

(10) Patent No.: US 9,179,556 B2
(45) Date of Patent: Nov. 3, 2015

(54) PREVENTING THE FORMATION OF CONDUCTIVE ANODIC FILAMENTS IN A PRINTED CIRCUIT BOARD

(75) Inventors: Joseph Kuczynski, Rochester, MN (US); Melissa K. Miller, Research Triangle Park, NC (US); Heidi D. Williams, Cary, NC (US); Jing Zhang, Poughkeepsie, NY (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 762 days.

(21) Appl. No.: 13/566,032

(22) Filed: Aug. 3, 2012

(65) Prior Publication Data

US 2014/0034375 A1    Feb. 6, 2014

(51) Int. Cl.
*H01K 3/10* (2006.01)
*H05K 3/42* (2006.01)

(52) U.S. Cl.
CPC ............. *H05K 3/42* (2013.01); *H05K 3/421* (2013.01); *H05K 2201/0317* (2013.01)

(58) Field of Classification Search
CPC . H05K 3/42; H05K 3/421; H05K 2201/0317; Y10T 29/49155; Y10T 29/49156; Y10T 29/49165
USPC ............ 29/846, 847, 852; 174/262; 427/97.2, 427/98.1; 438/627, 643, 648, 685, 687
See application file for complete search history.

(56) References Cited

U.S. PATENT DOCUMENTS

| | | | |
|---|---|---|---|
| 4,585,502 A * | 4/1986 | Uozu et al. | 29/852 |
| 4,604,314 A | 8/1986 | von Gentzkow et al. | |
| 5,052,103 A * | 10/1991 | Saitou | 29/852 |
| 6,458,696 B1 | 10/2002 | Gross | |
| 6,486,063 B2 * | 11/2002 | Yamasaki et al. | 438/687 |
| 6,781,064 B1 | 8/2004 | Appelt et al. | |
| 6,939,803 B2 | 9/2005 | Marathe et al. | |
| 7,615,705 B2 | 11/2009 | Chamberlin et al. | |
| 7,627,947 B2 | 12/2009 | Davis et al. | |
| 7,727,809 B2 | 6/2010 | Ito et al. | |
| 8,084,863 B2 | 12/2011 | Japp et al. | |
| 2008/0164057 A1 | 7/2008 | Mori et al. | |
| 2009/0233461 A1* | 9/2009 | Tourne | 29/831 |
| 2010/0193229 A1 | 8/2010 | Zhang | |
| 2011/0100697 A1 | 5/2011 | Yang et al. | |

OTHER PUBLICATIONS

Becker et al., "Diffusion barrier properties of tungsten nitride films grown by atomic layer deposition from bis(tert-butylimido)bis(dimethylamido)tungsten and ammonia", http://apps.webofknowledge.com/OutboundService.do?action=go, Apr. 7, 2003, 1 Page.

* cited by examiner

*Primary Examiner* — Donghai D Nguyen
(74) *Attorney, Agent, or Firm* — Katherine S. Brown; Jeffrey L. Streets

(57) ABSTRACT

A conductive via and method of forming a conductive via in a multilayer printed circuit board are disclosed. A hole is drilled into a printed circuit board that is reinforced with glass fibers, wherein the hole extends between two conductive elements on different layers of the printed circuit board and cuts through a portion of the glass fibers. A tungsten nitride layer is then deposited on the walls of the hole, wherein the tungsten nitride layer has a thickness between 1.5 nanometers and 20 nanometers. A copper layer is deposited over the tungsten nitride layer, wherein the copper and tungsten nitride form a conductive via that provides an electrically conductive pathway between the two conductive elements, and wherein the tungsten nitride layer isolates the copper layer from the glass fibers.

13 Claims, 1 Drawing Sheet

PREVENTING THE FORMATION OF CONDUCTIVE ANODIC FILAMENTS IN A PRINTED CIRCUIT BOARD

BACKGROUND OF THE INVENTION

1. Field of the Invention

The present invention relates to printed circuit board structures that include internal copper structures.

2. Background of the Related Art

A typical printed circuit board includes insulating layers and conducting layers that are laminated together using an epoxy resin prepreg. The insulating layers are made with dielectric materials such as polytetrafluoroethylene, composite epoxy materials, or fiberglass-reinforced epoxy laminate. The conducting layers are made of conductive metals, such as a thin copper foil. A prepreg is a material having pre-impregnated composite fibers, such as a woven or unidirectional glass fiber mat that is already impregnated with an epoxy resin.

The printed circuit board provides mechanical support for electronic components and provides electrically conductive pathways between those electronic components. These pathways may include traces formed on the surface of the printed circuit board or in any of the conducting layers. Some of the conducting layers may form other structures, such as a power plane or ground plane that supports the supply of electrical power to the electronic components on the board. Still further, the printed circuit board may include plated through holes that carry power or signals between the layers or surfaces of the board. A plated through hole (PTH) is formed by drilling a hole in the printed circuit board and then plating the walls of the hole with copper.

The glass fibers that extend through the printed circuit board provide strength and dimensional stability to the board. For example, it may be important to prevent thermal expansion of a printed circuit board as its temperature increases so that the electrical connections between electronic components are not affected.

BRIEF SUMMARY OF THE INVENTION

One embodiment of the present invention provides a method of forming a via in a multilayer printed circuit board. The method comprises drilling a hole into the printed circuit board that is reinforced with glass fibers, wherein the hole extends between two conductive elements on different layers of the printed circuit board and cuts through a portion of the glass fibers. A tungsten nitride layer is then deposited on the walls of the hole, wherein the tungsten nitride layer has a thickness between 1.5 nanometers and 20 nanometers. The method further comprises depositing a copper layer over the tungsten nitride layer, wherein the copper and tungsten nitride form a conductive via that provides an electrically conductive pathway between the two conductive elements, and wherein the tungsten nitride layer isolates the copper layer from the glass fibers.

Another embodiment of the invention provides an apparatus comprising a multilayer printed circuit board that is reinforced with glass fibers, and an electrically conductive via extending into the printed circuit board between two conductive elements on different layers of the printed circuit board and through a portion of the glass fibers. The via includes a tungsten nitride layer having a thickness between 1.5 nanometers and 20 nanometers and a copper layer over the tungsten nitride layer, such that the tungsten nitride layer isolates the copper layer from the glass fibers.

DETAILED DESCRIPTION OF THE INVENTION

Figure 1:
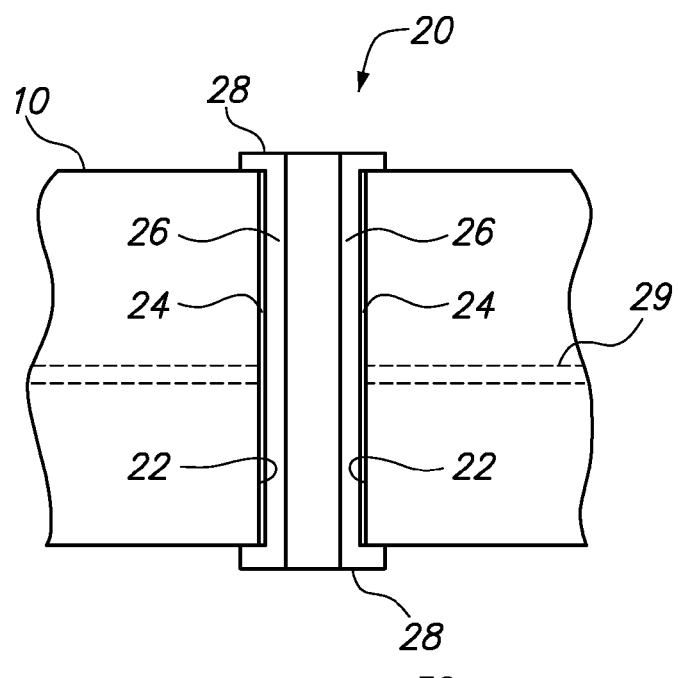
FIG. 1 is a cross-sectional side view of a printed circuit board having a plated through hole in accordance with the present invention.

One embodiment of the present invention provides a method of forming a via ("vertical interconnect access") in a multilayer printed circuit board. The method comprises drilling a hole into a printed circuit board that is reinforced with glass fibers, wherein the hole extends between two conductive elements on different layers of the printed circuit board and cuts through a portion of the glass fibers. A tungsten nitride layer is then deposited on the walls of the hole, wherein the tungsten nitride layer has a thickness between 1.5 nanometers and 20 nanometers. The method further comprises depositing a copper layer over the tungsten nitride layer, wherein the copper and tungsten nitride form a conductive via that provides an electrically conductive pathway between the two conductive elements, and wherein the tungsten nitride layer isolates the copper layer from the glass fibers.

Each end of a via typically terminates in a pad that makes electrical contact with conductive elements. Non-limiting examples of a conductive element include an electronic component secured to printed circuit board, a conductive trace formed on the surface of the printed circuit board, and a conductive trace or plane within the printed circuit board. A typical printed circuit board will include at least one conductive power plane and at least one conductive ground plane. Furthermore, the printed circuit board may comprise an epoxy resin.

The via extends between conductive layers of a printed circuit board. Depending upon which conductive layers are intended to be connected, the via may be selected from a plated through hole, a blind via, and a buried via. A "plated through hole" extends through all of the layers of the printed circuit board from a top surface to a bottom surface. A "blind via" extends from one surface of the printed circuit board to an internal conductive component, such as a trace, power plane or ground plane. A "buried via" extends between two internal conductive components, without extending to either of the top or bottom surfaces of the printed circuit board.

A tungsten nitride layer may be deposited on the walls of the hole using atomic layer deposition of tungsten nitride. A suitable vapor for use in the atomic layer deposition is bis (tert-butylimido)-bis-(dimethylamido)tungsten and ammonia. Such a process can produce a highly uniform, smooth, and conformal coating or layer of tungsten nitride (WN). The tungsten nitride layer serves as a barrier that prevents dissolution of the subsequently electroplated copper by isolating the copper from the glass cloth/resin interface, which may have undesirable pathways for conductive anodic filament (CAF) formation. By preventing copper dissolution, no conductive anodic filaments can be formed. Still, the tungsten nitride layer is electrically conductive and enables electrical contact to the copper traces or planes in the printed circuit board laminate. For example, the tungsten nitride layer may be in direct contact with at least one of the two conductive elements.

In another embodiment, the method further comprises masking the printed circuit board prior to the atomic layer deposition. The mask serves to prevent deposition on unintended areas of the printed circuit board. In one option, the mask that was used during atomic layer deposition of the tungsten nitride is left in place during subsequent deposition of the copper layer. Then, the method may further comprise stripping the mask after depositing the copper layer.

In yet another embodiment, the step of depositing a copper layer over the tungsten nitride layer includes electroplating a copper layer over the tungsten nitride layer. During the copper electroplating, the tungsten nitride layer functions as a seed layer.

Another embodiment of the invention provides an apparatus comprising a multilayer printed circuit board that is reinforced with glass fibers, and an electrically conductive via extending into the printed circuit board between two conductive elements on different layers of the printed circuit board and through a portion of the glass fibers. The via includes a tungsten nitride layer having a thickness between 1.5 nanometers and 20 nanometers and a copper layer over the tungsten nitride layer, such that the tungsten nitride layer isolates the copper layer from the glass fibers. Although the tungsten nitride layer may have a thickness between 1.5 nanometers and 20 nanometers, the tungsten nitride layer preferably has a thickness between 1.5 nanometers and 10 nanometers.

The multilayer printed circuit board may have any number of conductive layers alternating with dielectric layers, such as an epoxy resin composite. Consistent with the foregoing methods, the electrically conductive tungsten nitride layer may be in direct contact with at least one of the two conductive elements. The copper layer is disposed on the tungsten nitride layer such that the copper layer is isolated from the epoxy/glass fiber interface. The via may be selected from a plated through hole, a blind via, a buried via, or other types of vias now known or developed in the future.

The tungsten nitride barrier of the present invention prevents the formation of conductive anodic filaments (CAF) that can form a conductive bridge between two copper structures. Such a conductive bridge can interrupt the normal functioning of the circuits in a printed circuit board when electrical current is allowed to flow between the previously well-isolated copper structures.

Conductive anodic filaments can form when there is an electrical bias between two copper structures and the printed circuit board contains a physical pathway between the two copper structures. These conditions often exist at a vertical interconnect access (via) that extends between conductive layers of a printed circuit board. If the epoxy resin and glass fiber separate or delaminate, perhaps due to poor wetting of the epoxy resin into the glass fiber weave during manufacture of the printed circuit board, physical pathways can form along the glass fibers. Upon drilling a hole into the printed circuit board, these glass fibers and pathways become exposed along the wall of the hole. When the hole is subsequently plated with copper, the copper comes into direct contact with the exposed ends of glass fibers and pathways. If moisture is absorbed into the pathways, the conditions lead to the formation of conductive anodic filaments along the glass fiber pathways between a first copper structure functioning as an anode and a second copper structure functioning as a cathode. The mechanism of this electrochemical process involves oxidation and dissolution of copper at the anode, and the reduction of copper anions at the cathode to form copper metal. Catastrophic electrical failure only occurs when the filament of copper salts bridge the pathway between the two copper structures. The two copper structures may be two copper plated vias, a via and a copper plane, or possibly between two copper planes. However, conductive anodic filaments are most common along a glass fiber bundle that extends between two plated through holes.

FIG. 1 is a cross-sectional side view of a printed circuit board 10 having a plated through hole 20 in accordance with the present invention. Drilling through the printed circuit board 10 forms a cylindrical wall 22 that exposes the printed circuit board materials, such as epoxy resin and glass fibers (not shown). As discussed above, these glass fibers may partially separate from the epoxy resin layers and form open pathways through the printed circuit board 10. Accordingly, the present invention includes a tungsten nitride barrier layer 24 applied over the cylindrical wall 22. A copper layer 26 is then formed over the tungsten nitride barrier layer 24, such as through an electroplating process. Optionally, the copper material also forms circular pads 28 at the top and bottom surfaces of the printed circuit board 10. An electrical component or conductive trace may be disposed in contact with one or both of the pads 28 in order to provide electronic communication therebetween. The tungsten nitride layer 24 is electrically conductive, such that the plated through hole 20 may be in electrical communication with any internal element 29 of the printed circuit board 10 that is made to come into contact with the via 20. Examples of internal elements 29 include conductive traces, power planes, ground planes, or other discrete elements.

Figure 2:
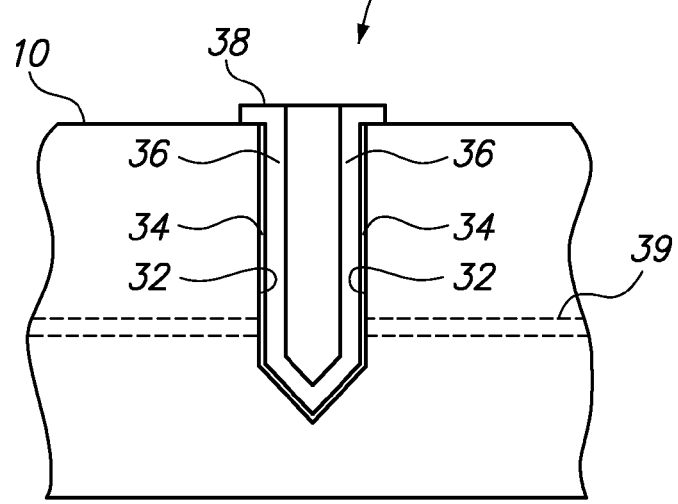
FIG. 2 is a cross-sectional side view of a printed circuit board having a blind via in accordance with the present invention.

FIG. 2 is a cross-sectional side view of a printed circuit board 10 having a blind via 30 in accordance with the present invention. The blind via 30 is formed with a hole that is drilled only partially through the thickness of the printed circuit board 10. As with the plated through hole 20 of FIG. 1, a tungsten nitride barrier layer 34 is applied over the cylindrical wall 32 and a copper layer 36 is then formed over the tungsten nitride barrier layer 34. The tungsten nitride layer 34 forms a barrier to prevent the formation of conductive anodic filaments (CAF) in the printed circuit board 10, but is electronically conductive to enable the plated blind via 30 to be in electrical communication with any internal element 39 of the printed circuit board 10 that is made to come into contact with the blind via 30. An optional pad 38 may also be formed to facilitate contact with a component secured to the top surface of the printed circuit board 10.

Figure 3:
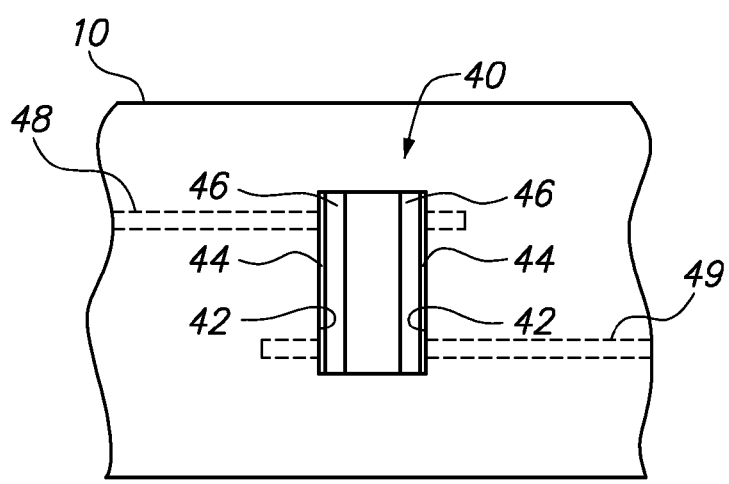
FIG. 3 is a cross-sectional side view of a printed circuit board having a buried via in accordance with the present invention.

FIG. 3 is a cross-sectional side view of a printed circuit board 10 having a buried via 40 in accordance with the present invention. Like the vias 20, 30 of FIGS. 1 and 2, the buried via 40 has a tungsten nitride layer 44 formed on the wall 42 of the buried via 40 and a copper layer 46 formed over the tungsten nitride barrier layer 44. The tungsten nitride layer 44 forms a barrier to prevent the formation of conductive anodic filaments (CAF) in the printed circuit board 10, but is electronically conductive to enable the plated blind via 30 to provide electrical communication between the internal elements 48, 49 that come into contact with the buried via 40.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a via in a multilayer printed circuit board comprising:
    drilling a hole into the printed circuit board that is reinforced with glass fibers, wherein the hole extends between two conductive elements on different layers and cuts through a portion of the glass fibers;
    depositing a tungsten nitride layer on walls of the hole, wherein the tungsten nitride layer has a thickness between 1.5 nanometers and 20 nanometers; and
    depositing a copper layer over the tungsten nitride layer, wherein the copper and tungsten nitride form a conductive via that provides an electrically conductive pathway between the two conductive elements, and wherein the tungsten nitride layer isolates the copper layer from the glass fibers.

2. The method of claim 1, wherein the step of depositing a tungsten nitride layer on the walls of the hole includes atomic layer deposition of tungsten nitride.

3. The method of claim 2, wherein the atomic layer deposition uses vapors of bis(tert-butylimido)-bis-(dimethylamido)tungsten and ammonia.

4. The method of claim 2, further comprising:
    masking the printed circuit board prior to the atomic layer deposition.

5. The method of claim 4, further comprising:
    stripping the mask after depositing the copper layer.

6. The method of claim 1, wherein the tungsten nitride layer has a thickness between 1.5 nanometers and 10 nanometers.

7. The method of claim 1, wherein the layer of tungsten nitride has an average thickness of between 1.5 nanometers and 20 nanometers.

8. The method of claim 1, wherein the layer of tungsten nitride has an average thickness of between 1.5 nanometers and 10 nanometers.

9. The method of claim 1, wherein the tungsten nitride layer is in direct contact with the at least one of the two conductive elements.

10. The method of claim 1, wherein the via is selected from a plated through hole, a blind via, and a buried via.

11. The method of claim 1, wherein the step of depositing a copper layer over the tungsten nitride layer includes electroplating the copper layer over the tungsten nitride layer.

12. The method of claim 11, wherein the tungsten nitride layer functions as a seed layer during electroplating of the copper layer.

13. The method of claim 1, wherein the printed circuit board comprises an epoxy resin.

* * * * *